(12) United States Patent
Ivanova-Hristova et al.

(10) Patent No.: US 8,597,997 B2
(45) Date of Patent: Dec. 3, 2013

(54) PROCESS FOR FABRICATING A CHARGE STORAGE LAYER OF A MEMORY CELL

(75) Inventors: Valentina Ivanova-Hristova, Grenoble (FR); Barbara De Salvo, Montbonnot Saint Martin (FR)

(73) Assignee: Commissariat a l'Energie Atomique, Paris (FR)

( * ) Notice: Subject to any disclaimer, the term of this patent is extended or adjusted under 35 U.S.C. 154(b) by 251 days.

(21) Appl. No.: 12/618,516

(22) Filed: Nov. 13, 2009

(65) Prior Publication Data
US 2010/0123222 A1 May 20, 2010

(30) Foreign Application Priority Data
Nov. 14, 2008 (FR) .................... 08 57737

(51) Int. Cl.
*H01L 21/336* (2006.01)
(52) U.S. Cl.
USPC .................... 438/257; 257/E21.209
(58) Field of Classification Search
USPC .................... 257/E21.209; 438/257
See application file for complete search history.

(56) References Cited

U.S. PATENT DOCUMENTS

| 4,788,097 A * | 11/1988 | Ohara et al. ............. 428/201 |
| 7,723,186 B2 * | 5/2010 | Purayath et al. .......... 438/264 |
| 7,776,758 B2 * | 8/2010 | Duan et al. .............. 438/758 |
| 7,829,927 B2 * | 11/2010 | Bidan et al. ............. 257/298 |
| 2006/0231889 A1 * | 10/2006 | Chen et al. .............. 257/325 |
| 2007/0154691 A1 | 7/2007 | Sung et al. |
| 2008/0191256 A1 | 8/2008 | Bidan et al. |
| 2008/0241559 A1 | 10/2008 | Joo et al. |

FOREIGN PATENT DOCUMENTS

FR 2889620 2/2007

OTHER PUBLICATIONS

Takata, M. et al., "New Non-Volatile Memory with Extremely High Density Metal Nano-Dots," Electron Devices Meeting, 2003, IEDM '03 Technical Digest, IEEE, pp. 22.5.1-22.5.4.
French Preliminary Search Report in French Application No. FR 0857737, dated Mar. 25, 2009.

* cited by examiner

*Primary Examiner* — Howard Weiss
(74) *Attorney, Agent, or Firm* — Nixon Peabody LLP

(57) ABSTRACT

A process for fabricating a charge storage layer comprising metal particles of a memory cell, said layer consisting of an organic layer comprising, on the surface, said metal particles, said process comprising the following steps: (a) a step of grafting, onto a metallic, semiconductor or electrically insulating substrate, an organic layer comprising, on the surface, groups capable of complexing at least one metallic element in cationic form; (b) a step of bringing said layer into contact with a solution comprising said metallic element in cationic form, by means of which said metallic element is complexed by said abovementioned groups; and (c) a step of reducing said complexed metallic element to the metallic element in oxidation state 0, by means of which metal particles are obtained.

9 Claims, 4 Drawing Sheets

PROCESS FOR FABRICATING A CHARGE STORAGE LAYER OF A MEMORY CELL

CROSS REFERENCE TO RELATED APPLICATIONS OR PRIORITY CLAIM

This application claims priority of French Patent Application No. 08 57737, filed Nov. 14, 2008.

TECHNICAL FIELD

The invention relates to a process for fabricating a charge storage layer intended for a memory cell, this layer consisting of an organic layer comprising, on its surface, metal particles.

In particular, this process may be applicable in designing capacitive memory devices or resistive memory devices.

Thus, the general field of the invention is that of memory devices.

PRIOR ART

Memory devices are formed from base elements—the memory cells intended for data storage. There are several types of memories:

memories of the RAM (random access memory) type, which are referred to as "volatile" memories as the data contained therein is lost after a few seconds when the power supply is cut off, it being possible for data to be written into, read from or rewritten into said memories as many times as necessary;

memories of the ROM (read-only memory) type which are memories programmed by the manufacturer and are referred to as "non-volatile" memories since they retain the data contained therein in the absence of supply voltage, the data in said memories being accessible only at read-out; and flash memories combining the advantages of random-access memories (in terms of writing, reading and erasing data blocks) and the advantages of read-only memories (in terms of permanence of the content even with no voltage), the "flash" deriving from the fact that the memory erasing operations are very rapid, because of the fact that these memories can be erased sector by sector and not cell by cell.

At the present time, flash memories, in particular because of their retention capability (which may last for the order of 10 years) and their integratability, have been the subject of substantial development, especially because of their applications in modern electronic systems, such as portable computers, cellular telephones, digital cameras, flash memory cards and GPS location systems.

The structure of an elementary cell of a flash memory of a field-effect transistor is shown in appended FIG. 1.

Such a transistor 1 comprises, respectively, a substrate 3, a channel 5, a source 7, a drain 9 and, on the channel, a tunnel dielectric 11, a floating gate 13, a control dielectric 15 and a control gate 17 respectively. The term "floating gate" denotes an electrically isolated gate having a charge storage function, i.e., in other words, an information storage element. This floating gate conventionally takes the form of a continuous layer made of a material such as n-doped polycrystalline silicon. This is thus referred to as a continuous floating gate.

At the present time, a wish is to increase the storage capacity of memory devices while miniaturizing their constituent elementary cells. To do this, novel architectures and novel materials are being currently studied.

Thus, one solution may consist in preserving the architecture of a conventional flash memory cell as defined above, but by modifying the structure of the floating gate. It has thus been proposed to incorporate, into these cells, discrete trapping sites as the floating gate. Discrete trapping sites have the advantage of being able to be electrically isolated from one another. Thus, the presence of a defect in the tunnel dielectric, which causes complete discharge in the case of a device with a continuous floating gate, affects only the charge located close to the defect. This novel architecture involving discrete trapping sites may thus make it possible to reduce the thickness of the tunnel dielectric and, as a consequence, to reduce the potentials necessary for operating the memory, while maintaining good retention and endurance characteristics. As particularly advantageous discrete trapping sites, mention may be made of metal nanoislands (metal islands of nanoscale size) acting as storage sites incorporated into an insulating matrix.

Such a memory cell has been described by the authors Takata et al., in the article "New Non-Volatile Memory with Extremely High Density Metal Nano-Dots", 0-7803-7873-3/03/$17.00(c)2003 IEEE. This memory cell comprises a floating gate in the form of metal nanoparticles coated with $SiO_2$.

This floating gate is obtained by sputtering a target comprising both $SiO_2$ and the metal particles, in this case here cobalt particles.

Such charge storage films obtained by this technique have the following drawbacks:

the metal nanoparticles do not have a uniform size distribution within the layer, owing to the impossibility of controlling the size distribution thereof by the sputtering technique; and there is no precise location by uniformity and order in the spatial distribution of the particles in the storage layer, the distribution being the same throughout the thickness of said layer.

There is therefore a real need for a novel charge-storage film (or layer) architecture and a process for fabricating said architecture that enables the drawbacks of the prior art to be overcome.

SUMMARY OF THE INVENTION

The authors of the invention have developed a novel architecture and a process for fabricating a charge storage layer of a memory cell, which makes it possible to solve the drawbacks of the prior art, especially the problems of uniformity in terms of size and spatial position of the trapping sites.

Thus, according to a first aspect, the invention relates to a process for fabricating a charge storage layer comprising metal particles of a memory cell, said layer consisting of an organic layer comprising, on the surface, said metal particles, said process comprising the following steps:

a step of grafting, onto a metallic, semiconductor or electrically insulating substrate, an organic layer comprising, on the surface, groups capable of complexing at least one metallic element in cationic form;

a step of bringing said layer into contact with a solution comprising said metallic element in cationic form, by means of which said metallic element is complexed by said abovementioned groups; and a step of reducing said complexed metallic element to the metallic element in oxidation state 0, by means of which metal particles are obtained.

Before going into greater detail in the description, we propose the following definitions:

"grafting" is understood within the context of the invention to mean, as is conventional, immobilization of said abovementioned layer on the abovementioned substrate by means of a covalent chemical bond, the formation of a covalent bond being made possible by an appropriate choice of the compounds that may be contained in the composition of said layer, these compounds comprising a chemical group capable of reacting with a group present on the surface of the substrate, so as to form a covalent bond; and the expression "group capable of complexing at least one metallic element" is understood to mean a chemical group capable of fixing said metallic element by a coordination bond.

The following advantages stem from implementing this novel process:

the possibility of controlling the amount of metal particles in the layer by optimizing, during the first step, the amount of groups capable of complexing the metallic element in cationic form;

the possibility of controlling the uniformity of said particles in the layer, again by optimizing the grafting of the organic layer; and the possibility of controlling the size of the metal particles by optimizing the cation complexing time.

The metal particles are conventionally nanoparticles, namely particles having an average particle size ranging from 3 to 10 nm, these particles possibly being made of a metal chosen from Pd, Pt, Ru, Co, Ni, W, Ti, Mo, Au and Ag.

The substrate acting as base for grafting the organic layer may be an electrically insulating substrate, such as a substrate made of $SiO_2$ (silica), $Al_2O_3$, SiN, $HfO_2$, HfAlO, HfSiO or $La_2O_3$, a semiconductor substrate, such as a substrate made of silicon Si, germanium Ge or a silicon-germanium alloy, or a metal substrate (for example an Au, Al, Cu, Ti or Pt electrode).

Advantageously, the grafted organic layer is a self-assembled organic layer.

It should be pointed out that the term "self-assembled layer" is understood to mean a layer, the cohesion of which is ensured by an appropriate choice of the constituent compounds, this cohesion being advantageously provided by means of Van der Waals bonds, dipole-dipole bonds or hydrogen bonds, these bonds existing between the chains of the compounds grafted onto the surface of the substrate. Thus, these may be referred to as intra-chain bonds.

In particular, the self-assembled layer may be a self-assembled monolayer (an SAM) or self-assembled multilayers.

According to the invention, the grafting step may consist in bringing said substrate into contact with at least one compound comprising at least a first group capable of reacting with a group present on the surface of said substrate in order to form a covalent bond and at least a second group capable of complexing at least one metallic element, said first group and said second group possibly being separated by a hydrocarbon chain having one or more carbon atoms.

During this contacting step, the abovementioned compounds react by means of the first group as defined above with a group on the surface of the substrate, whereas the hydrocarbon chains react together spontaneously to form Van der Waals or hydrogen bonds, thus forming a self-assembled layer, the thickness of the layer being made up of all the hydrocarbon chains.

Thus, the second groups as defined above are flush with the surface of said layer.

Said first group capable of reacting with the surface of said substrate in order to form a covalent bond, possibly after hydrolysis of the latter, may be a group chosen from a halogen atom, a group —OH and an alkoxy group.

Said second group capable of complexing a metallic element may be a group comprising an atom carrying a free doublet, such as an amine, thiol or —OH group, and/or a negative charge, such as a carboxyl group.

The compound may satisfy one of the following formulae:

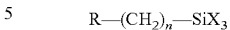

R—$(CH_2)_n$—$SiX_3$ in which:

the X symbols represent groups capable of being grafted, possibly after hydrolysis, onto the surface of the substrate, these groups being chosen, independently, from halogen atoms and alkoxy groups;

R is chosen from amine, carboxyl, thiol and —OH groups; and n is an integer equal to or greater than 1;

R—$X^1$ in which:

—R is chosen from amine, carboxyl, thiol and —OH groups; and $X^1$ is Li or $MgX^2$, $X^2$ being a halogen atom; and R—OH in which R is chosen from amine, carboxyl, thiol and —OH groups.

As mentioned above, the compounds comprise groups capable, after a possible transformation, of reacting with groups present on the surface of the substrate in order to form a covalent bond.

Prior to the abovementioned contacting step, the process may include a step of treating said substrate so as to create, on its surface, reactive groups that will be capable of reacting with the first groups of the abovementioned compound.

This treatment step may consist of a hydroxylation of the substrate so as to create hydroxyl groups on its surface. Thus, with a substrate made of silicon oxide, the hydroxylation treatment may consist in subjecting the substrate to an acid treatment in the presence of hydrogen peroxide.

Thus, to give an example, the contacting step may consist in making a silicon oxide substrate, having —OH groups on its surface, react with a compound of formula R—$(CH_2)_n$—$SiX_3$ in aqueous medium. In the presence of water, the X groups hydrolyze to —OH groups to give the compound R—$(CH_2)_n$—$Si(OH)_3$. The reaction scheme for forming the layer may thus be the following:

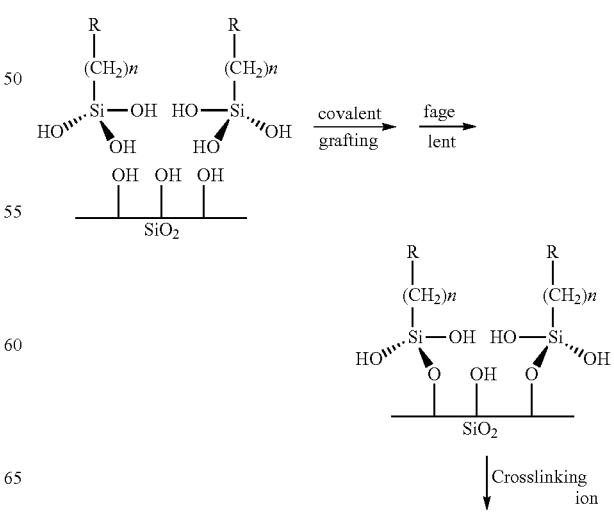

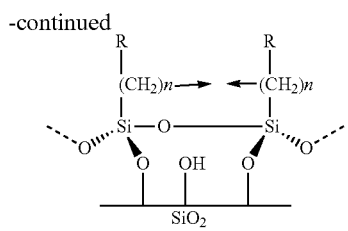

The —(CH$_2$)$_n$— hydrocarbon chains facing one another interact by means of Van der Waals bonds so as to form a self-assembled layer, as indicated by the arrows in the scheme illustrated above.

With compounds of the R—X$^1$ and R—OH type, the covalent grafting may be carried out with substrates having, on their surface, facing OH and X$^1$ reactive groups, which may be halogen (Cl, Br, I) atoms or hydrogen atoms.

In the case of a silicon substrate, the grafting may require a substrate treatment step in order to form C-halogen bonds, this treatment possibly being one of the following:

to form a C—Cl bond, a treatment of the silicon substrate in the presence of PCl$_5$ or Cl$_2$;

to form a C—Br bond, a treatment of the silicon substrate in the presence of N-bromosuccinimide and CCl$_3$Br; and to form a C—I bond, a treatment of the silicon substrate in the presence of I$_2$ or CHI$_3$.

From a practical standpoint, the abovementioned compounds are brought into contact with the substrate in the form of a solution having a molar concentration ranging from $10^{-6}$M to $10^{-2}$M, for example $10^{-3}$M, the contacting step being maintained until formation of the grafted layer, which formation may be visualized by a suitable technique (such as atomic force microscopy, scanning electron microscopy or tunnel electron microscopy), the contacting time possibly ranging from 1 hour to 2 days. Advantageously, the solution will have a molar concentration of $10^{-6}$M in the case of metal substrates and a molar concentration of $10^{-3}$M for semiconductor substrates and insulating substrates (such as oxide substrates).

The solution containing the compound may be a solution containing said compound dissolved in an alkane solvent.

Once the organic layer has been grafted onto the substrate, the next step is to bring the substrate thus grafted into contact with a solution comprising said metallic element in ionic form, by means of which said metallic element is complexed by said abovementioned groups.

This solution may be a solution comprising metal cations chosen from platinum, palladium, ruthenium, cobalt and nickel cations and mixtures of said cations.

The contacting time is determined so as to allow said metal cations to be complexed by the appropriate groups of the grafted organic layer, this time possibly extending from a few seconds to one hour, for example 15 minutes.

The substrate grafted by the complexed organic layer is then subjected to a reduction step intended to reduce the metal cations to the metal in oxidation state 0, the cations thus being converted to metal particles.

Prior to the reduction step, the substrate may be made to undergo a rinsing step so as to remove the uncomplexed metallic elements.

This reduction may be carried out according to several methods of implementation.

According to a first method of implementation, the reduction is carried out by applying an electrode potential sufficient to obtain said reduction to the substrate immersed in an electrolyte. This method of implementation corresponds to the technique of electrodeposition or electrolytic deposition.

According to a second method of implementation, the reduction is carried out by bringing the substrate immersed in an electrolyte into contact with a reducing agent. This reducing agent may be dimethylamine borane (known by the abbreviation DMAB), formaldehyde, hypophosphite, potassium borohydrate or hydrazine. This method of implementation corresponds to the technique of electroless deposition.

Whether regards the first or the second method of implementation, the electrolyte is conventionally an aqueous acid solution, for example an aqueous H$_2$SO$_4$ (sulphuric acid) solution (such as a 0.1M H$_2$SO$_4$ solution), this solution having to be free of metal ions so that there is no reduction other than that of the complexed metal cations on the organic layer.

Once the reduction has taken place, the metal atoms may spontaneously undergo the phenomenon of coalescence, thus forming metal islands.

After the reduction step, the metal atoms may form monoatomic islands heightwise, with a lateral size that may range from 4 to 6 nm, which islands are uniformly dispersed on top of the organic layer, with a density that may possibly range from $10^{11}$ islands/cm$^2$ to $10^{13}$ islands/cm$^2$. The density and the size of the islands may be determined by AFM, STM or TEM microscopy.

The metal particles thus obtained may be used in electronic devices as discrete trapping sites, while the subjacent organic layer will act as dielectric.

Depending on the envisaged application, in particular to increase the size of the metal islands, the process of the invention may include, after the reduction step, a deposition step in which at least a second metal layer is deposited on the organic surface having metal particles on its surface. This second metal layer may be deposited by an electrochemical deposition technique. In this case, the previously obtained metal particles may fulfil the role of nucleation sites for depositing the metal layer. In the case of electroless deposition, the metal particles deposited beforehand may fulfil the role of catalyst. To give an example, when the metal particles are palladium particles, they may thus act as a catalyst for reducing the second metallic element intended, after completion of the reduction, to form the metal layer.

According to a second aspect, the invention relates to a charge storage layer coating a metallic, semiconductor or electrically insulating substrate of a memory cell, which can be obtained by the abovementioned process, said layer consisting of an organic layer grafted onto said substrate and comprising, on its surface, metal particles.

The substrate and metal particle characteristics are identical to those already mentioned above in the context of the description of the process.

As regards the organic layer, this may derive from compounds as defined above.

Such a storage layer is intended to be incorporated into memory cells intended to form part of devices that may be of several types:

capacitive memory devices, corresponding to a field-effect transistor in which the charge storage layer will constitute one of the elements of the transistor, it being possible in particular for this layer to act as floating gate; and resistive memory devices, corresponding to a memory cell in which the charge storage layer as defined above may be placed between two electrodes.

Thus, the invention relates to a memory cell comprising at least one charge storage layer coating a metallic, semiconductor or electrically insulating substrate as defined above, this memory cell possibly being a capacitive or resistive memory cell.

In particular, the memory cell of the invention may be a field-effect transistor that may include at least one charge storage layer as defined above.

The field-effect transistor may adopt various configurations, as shown in FIGS. 2, 3, 4 and 5.

Thus, in a first configuration, as shown in FIG. 2, the field-effect transistor 19 comprises:

a substrate 21 having a channel 23;

a source 25 and a drain 27 placed on either side of the channel and in electrical contact therewith; and a control gate 29 placed above the channel and separated therefrom by a control dielectric 31, a floating gate 33 and a tunnel dielectric 35, the floating gate 33 consisting of the charge storage layer as mentioned above, said floating gate being subdivided into two parts, namely the organic layer 37 and, at the top of said layer, metal particles 39, and being produced by one or more deposition steps.

In a second configuration, a variant of the first, as shown in FIG. 3, the field-effect transistor comprises, in addition to the various parts of the field-effect transistor of the first configuration, a dielectric layer 41 surmounted by a second charge storage layer 43 according to the invention, this succession of two layers being placed between the control dielectric 31 and the first charge storage layer 33.

Likewise, another configuration may comprise n floating gates (n being an integer equal to or greater than 1) separated by dielectric layers.

In both these configurations, the control gate may be made of polycrystalline silicon or made of a metal, such as Pt or W, or made of a nitride, such as TaN, WN or TiN.

In a third configuration, as shown in FIG. 4, the field-effect transistor comprises, between the control gate 29 and the channel 23, respectively, a charge storage layer 33 according to the invention deposited on the channel and an insulating organic layer 45, for example identical to that constituting the charge storage layers of the invention, which layer 45 is interposed between the control gate 29 and the charge storage layer 33.

In a fourth configuration, as shown in FIG. 5, the field-effect transistor comprises, between the control gate 29 and the channel 23, respectively, a first charge storage layer 33 deposited on the channel, a second charge storage layer 47 deposited on said first charge storage layer 33 and an insulating organic layer 49, for example identical to that constituting the charge storage layers of the invention, which layer 49 is interposed between the control gate 29 and said second charge storage layer 47.

Likewise, another configuration may comprise n charge storage layers (where n is an integer equal to or greater than 1) separated by organic layers.

The various parts (channel, source, drain, tunnel dielectric, control dielectric) of these devices are produced by conventional techniques known to those skilled in the art that are suitable for metal particles, whereas the charge storage layer (s) according to the invention is (are) produced by a process according to the invention.

The control gate may be produced by conventional techniques or in a manner similar to the storage layer, by carrying out several complexing operations and by adjusting the complexing time so as to obtain a continuous metal layer.

As mentioned above, the invention may also relate to a resistive memory cell comprising at least one charge storage layer according to the invention, especially a resistive device, which could, for example, be included in what is called a "crossbar" memory matrix architecture.

Such a device may adopt various configurations, as shown in FIGS. 6 to 9.

Thus, in a first configuration as shown in FIG. 6, the resistive memory cell 51 comprises:

a lower electrode 53, for example a metal electrode (such as an Al, Au, Ti or Cu electrode), a nitride electrode (such as a TiN or TaN electrode) or an electrode made of a semiconductor material (such as an Si, Ge or SiGe electrode);

a first solid dielectric 55 deposited on said lower electrode;

a charge storage layer 57 deposited on the first dielectric;

a second solid dielectric 59 deposited on said charge storage layer 57; and a metal or semiconductor upper electrode 61 placed on said second dielectric 59.

In a second configuration as shown in FIG. 7, the resistive memory cell comprises, in addition to the various parts of the cell of the first configuration, a dielectric layer 63 surmounted by a second charge storage layer 65 according to the invention, this succession of two layers being placed between the first charge storage layer 57 and the second dielectric 59.

In a third configuration as shown in FIG. 8, the resistive memory cell comprises, between the lower electrode 53 and the upper electrode 61, respectively, a charge storage layer 57 according to the invention deposited on the lower electrode and an insulating organic layer 67, for example identical to that constituting the charge storage layers of the invention, which layer 67 is interposed between the charge storage layer 57 and the upper electrode 61.

Finally, in a fourth configuration as shown in FIG. 9, the resistive memory cell comprises, between the lower electrode 53 and the upper electrode 61, respectively, a first charge storage layer 57 deposited on the lower electrode 53, a second charge storage layer 69 deposited on said first charge storage layer 57 and an insulating organic layer 67, for example identical to that constituting the charge storage layers of the invention, which layer 67 is interposed between the lower electrode and the upper electrode.

Likewise, another configuration may comprise n storage layers (n being an integer equal to or greater than 1) separated by organic layers.

The upper electrode may be produced by conventional techniques or in a similar manner to the storage layer, by carrying out several complexing steps and by adjusting the complexing time so as to obtain a continuous metal layer.

The invention will now be described in relation to the following examples, given by way of illustration but implying no limitation.

DETAILED DESCRIPTION OF PARTICULAR EMBODIMENTS

Figure 1:
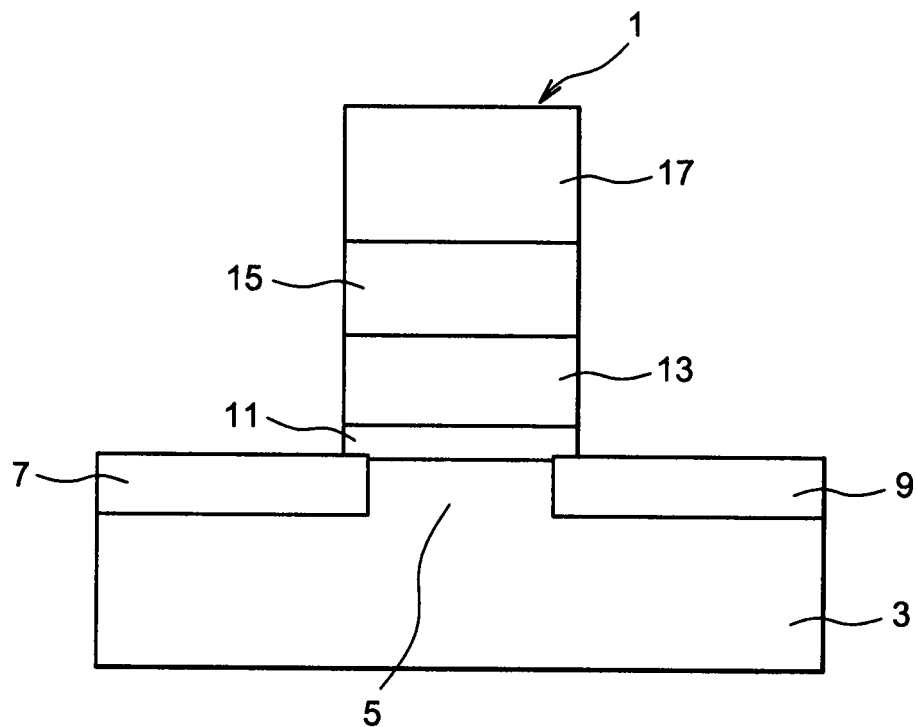
FIG. 1 is a sectional view of a conventional memory cell of the "field-effect transistor" type.
Figure 2:
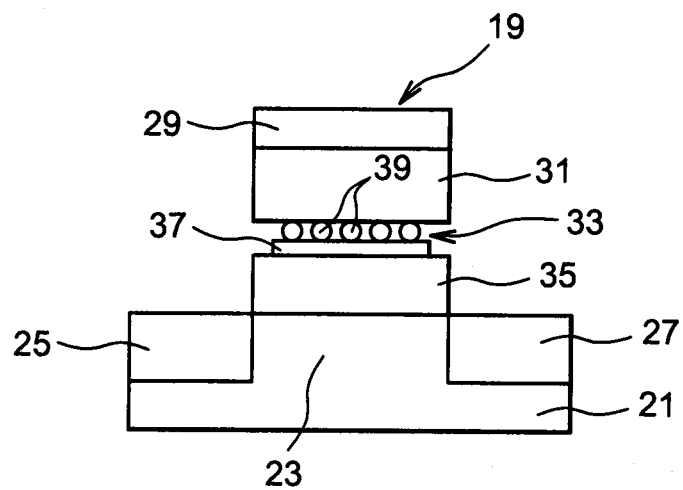
FIGS. 2 to 5 represent various configurations of a field-effect transistor comprising at least one charge storage layer according to the invention.
Figure 3:
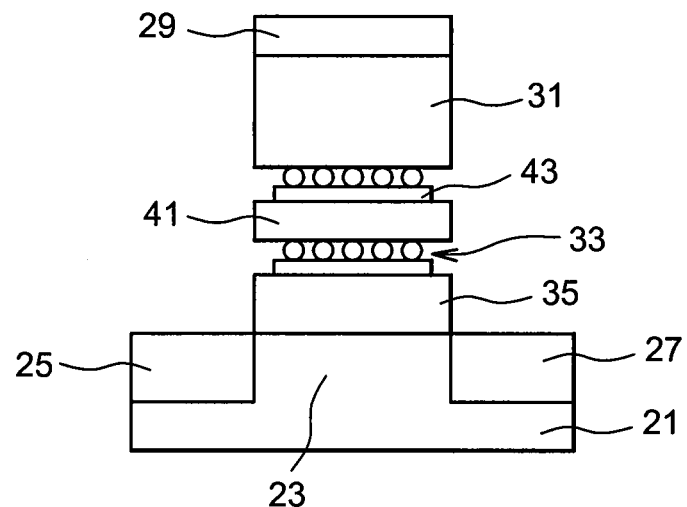
Figure 4:
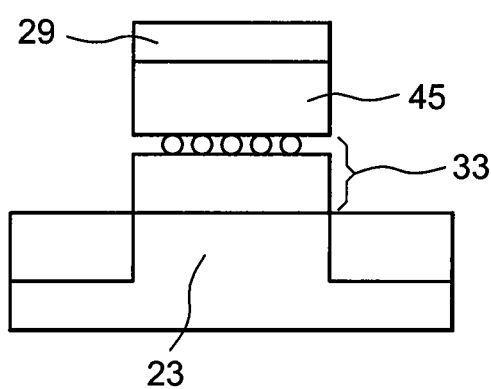
Figure 5:
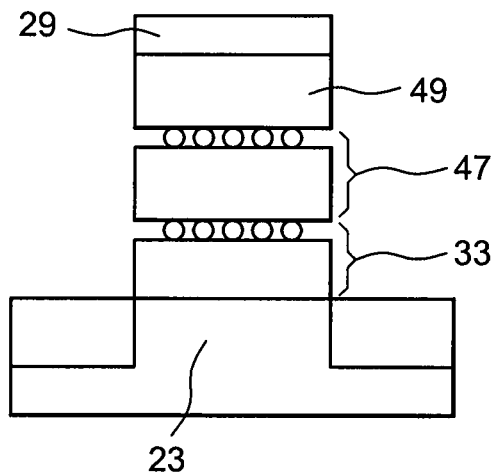
Figure 6:
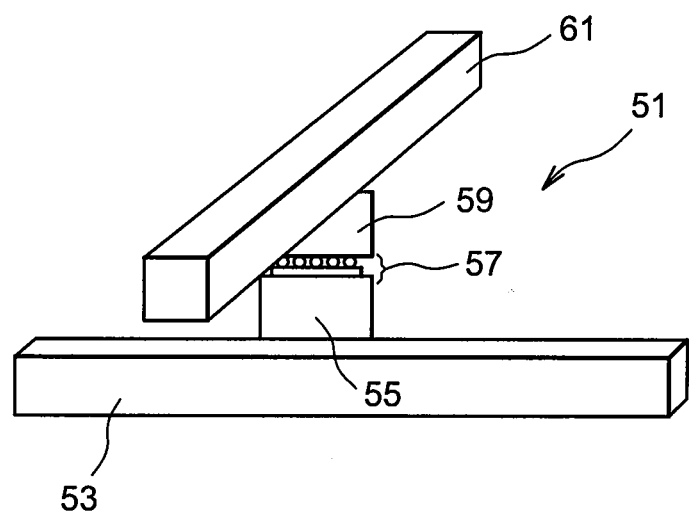
FIGS. 6 to 9 show various configurations of a resistive memory cell comprising at least one charge storage layer according to the invention.
Figure 7:
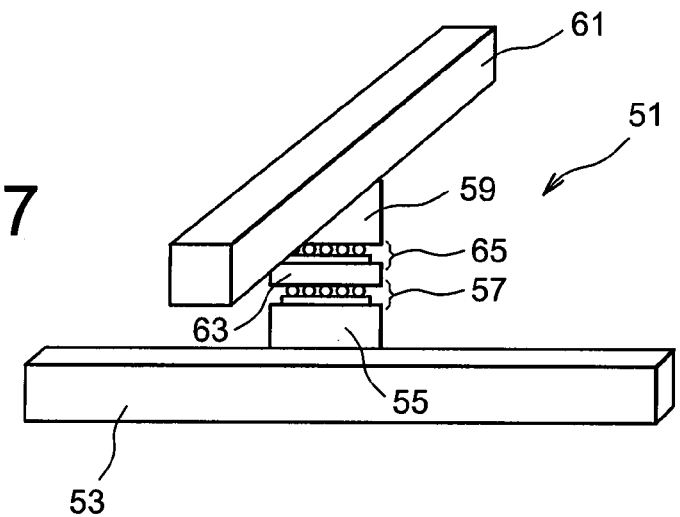
Figure 8:
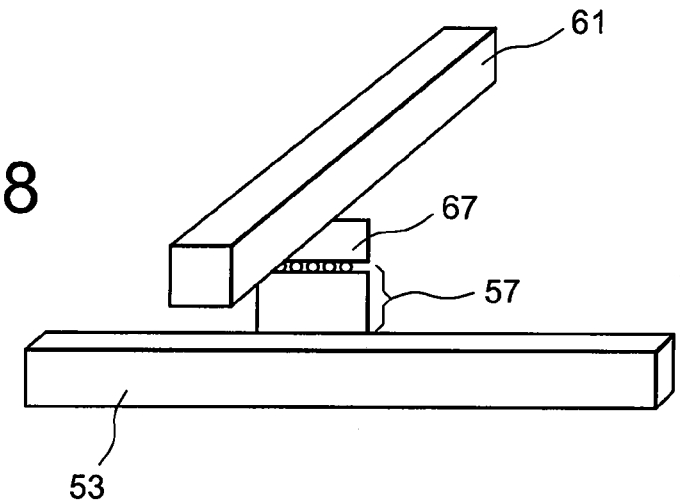
Figure 9:
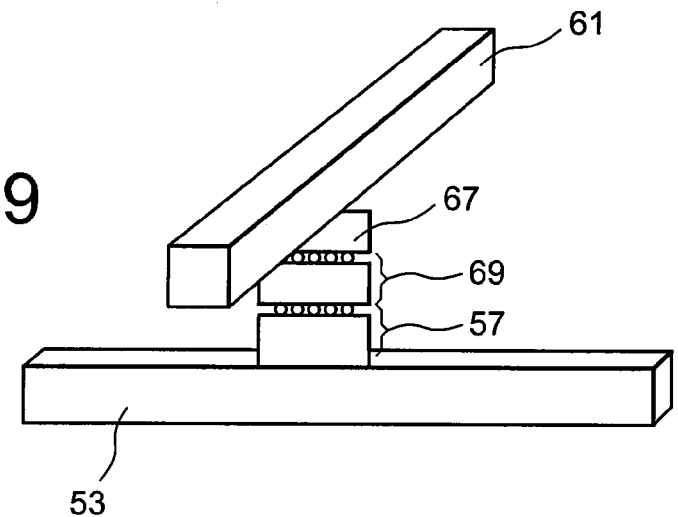

The example below illustrates the fabrication according to the invention of a storage layer on a gold substrate.

EXAMPLE

In a first step, a (111)Au gold electrode was immersed for 5 minutes with no potential control in an aqueous solution comprising 4,4'-dithiopyridine (abbreviated to 4-PySSPy, Aldrich, 98% purity), in a 20 µM molar concentration, said solution being prepared from ultrapure water (Sartorius, Germany) deaerated beforehand so as to prevent the thiol group from oxidizing. As the result of this immersion step, a 4-mercaptopyridine self-assembled monolayer was formed on the surface of the electrode.

The electrode thus treated was then carefully rinsed with water and then the electrode was again immersed without potential control in a 0.1 mM solution of $K_2PtCl_4$ (Aldrich, 99.99% purity) and 0.1M $H_2SO_4$ (Merck, ultrapure) so that the Pt ions were adsorbed and became complexed on the self-assembled monolayer. After rinsing with water again, the electrode was then transferred to an electrochemical cell containing only 0.1M $H_2SO_4$ and subjected to a potential scan so that the complexed Pt ions underwent electroreduction to form metallic platinum particles.

The invention claimed is:

1. Process for fabricating a charge storage layer comprising metal particles of a memory cell, said layer consisting of an organic layer comprising, on the surface, said metal particles, said process comprising the following steps:
    a step of grafting, onto a metallic, semiconductor or electrically insulating substrate, an organic layer comprising, on the surface, groups capable of complexing at least one metallic element in cationic form;
    a step of bringing said layer into contact with a solution comprising said metallic element in cationic form, by means of which said metallic element is complexed by said abovementioned groups; and
    a step of forming the metal particles by reducing said complexed metallic element to oxidation state 0.

2. Fabrication process according to claim 1, in which the organic layer is a self-assembled organic layer.

3. Fabrication process according to claim 1, in which the grafting step is carried out by bringing said substrate into contact with at least one compound comprising at least a first group capable of reacting with a group present on the surface of said substrate in order to form a covalent bond and at least a second group capable of complexing at least one metallic element, said first group and said second group possibly being separated by a hydrocarbon chain having one or more carbon atoms.

4. Fabrication process according to claim 3, in which the second group capable of complexing a metallic element is a group comprising an atom carrying a free doublet and/or a negative charge.

5. Fabrication process according to claim 3, in which the compound satisfies one of the following formulae:

$$R\text{—}(CH_2)_n\text{—}SiX_3$$

in which:
    the X symbols represent groups capable of being grafted, possibly after hydrolysis, onto the surface of the substrate, these groups being chosen, independently, from halogen atoms and alkoxy groups;
    R is chosen from amine, carboxyl, thiol and —OH groups; and
    n is an integer equal to or greater than 1;

$$R\text{—}X^1$$

in which:
    R is chosen from amine, carboxyl, thiol and —OH groups; and
    $X^1$ is Li or $MgX^2$, $X^2$ being a halogen atom; and $$R\text{—}OH$$

in which R is chosen from amine, carboxyl, thiol and —OH groups.

6. Fabrication process according to claim 3, furthermore including, before the grafting step, a step of treating said substrate so as to create, on its surface, reactive groups that will be capable of reacting with a first group capable of reacting with a group present on the surface of said substrate in order to form a covalent bond.

7. Process according to claim 1, in which the solution is a solution comprising metal cations chosen from platinum, palladium, ruthenium, cobalt and nickel cations and mixtures of said cations.

8. Process according to claim 1, in which the reduction step is carried out by applying an electrode potential sufficient to obtain said reduction to the substrate immersed in an electrolyte.

9. Process according to claim 1, in which the reduction step is carried out by bringing the substrate immersed in an electrolyte into contact with a reducing agent.

* * * * *